US011769541B2

(12) United States Patent
Li et al.

(10) Patent No.: US 11,769,541 B2
(45) Date of Patent: Sep. 26, 2023

(54) MEMORY DEVICE BASED ON FERROELECTRIC CAPACITOR

(71) Applicant: TSINGHUA UNIVERSITY, Beijing (CN)

(72) Inventors: Xueqing Li, Beijing (CN); Xiyu He, Beijing (CN); Xiaoyang Ma, Beijing (CN); Juejian Wu, Beijing (CN); Zhiyang Xing, Beijing (CN); Yongpan Liu, Beijing (CN); Huazhong Yang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 17/831,581

(22) Filed: Jun. 3, 2022

(65) Prior Publication Data
US 2022/0392508 A1 Dec. 8, 2022

(30) Foreign Application Priority Data

Jun. 3, 2021 (CN) .......................... 202110619747.5

(51) Int. Cl.
G11C 11/22 (2006.01)
G11C 11/56 (2006.01)

(52) U.S. Cl.
CPC ........ G11C 11/221 (2013.01); G11C 11/2273 (2013.01); G11C 11/2275 (2013.01); G11C 11/5657 (2013.01)

(58) Field of Classification Search
CPC .............. G11C 11/221; G11C 11/2273; G11C 11/2275; G11C 11/5657
See application file for complete search history.

(56) References Cited

U.S. PATENT DOCUMENTS 6,091,624 A      7/2000   Kang
8,605,477 B2 *  12/2013   Takemura ............. H01L 27/105
                                                       365/51
2006/0083098 A1*  4/2006   Ho ........................ G11C 11/565
                                                    365/230.05

FOREIGN PATENT DOCUMENTS

CN   104637948 A   5/2015
CN   110415744 A   11/2019
EP     3506265 A1   7/2019

* cited by examiner

Primary Examiner — Han Yang
(74) Attorney, Agent, or Firm — MARSHALL, GERSTEIN & BORUN LLP

(57) ABSTRACT

The present disclosure relates to a memory device based on a ferroelectric capacitor, which includes a control unit for writing data into a memory cell or reading data from the memory cell and a plurality of memory cells arranged in an array; each memory cell includes an external interface, a first switch, a transistor, a first capacitor and a second capacitor, wherein at least one of the first capacitor and the second capacitor is a ferroelectric capacitor; the first switch has a first port connected with a first word line, a second port connected with a bit line, and a third port connected with one end of the first capacitor; and the transistor has a gate electrode connected with another end of the first capacitor and one end of the second capacitor, a source electrode connected with a first read terminal, and a drain electrode connected with a second read terminal, wherein another end of the second capacitor is connected with a second word line. According to the present disclosure, a polarized state of the ferroelectric capacitor in the memory cell is held or changed based on hysteresis characteristics of the ferroelectric capacitor, and the control unit is used to write data into or read data from the memory cell, which can implement (Continued)

non-destructive reading of data and longer endurance of a write operation.

15 Claims, 7 Drawing Sheets

MEMORY DEVICE BASED ON FERROELECTRIC CAPACITOR

CROSS-REFERENCE TO RELATED APPLICATION

The present application claims priority to Chinese Application No. 202110619747.5, filed Jun. 3, 2021. The priority application, CN 202110619747.5, is hereby incorporated by reference.

TECHNICAL FIELD

The present disclosure relates to the technical field of structure design of nonvolatile memories with low power consumption, and particularly to a memory device based on a ferroelectric capacitor.

BACKGROUND

Memory is an indispensable part of an electronic information processing system. An embedded memory on chip mainly adopts a complementary metal-oxide-semiconductor (CMOS) technology. In the past, with the continuous progress of the CMOS technology, the performance of the memory is also improved constantly. However, in recent years, on the one hand, the CMOS technology approaches the physical limit continuously, the advancement of Moore's Law has slowed down significantly; at the same time, the current leakage problem of transistors caused by size reduction becomes more and more serious, which makes the power consumption of memory higher and higher, such that the development of the memory encounters obvious bottlenecks. On the other hand, the rapid development of artificial intelligence, the Internet of Things and other fields has put forward higher requirements for performance indexes such as memory capacity, speed and power consumption. Under this background, the nonvolatile memory (NVM) can still save data even when power is off, and has the characteristics of high density and fast reading speed, which can improve the overall performance of the system. Therefore, the nonvolatile memory has attracted much attention in recent years.

The nonvolatile memory is mainly classified into two categories: resistive memory and ferroelectric memory. The resistive memory represented by an resistive random access memory (RRAM) and a spin-transfer torque random access memory (STT-RAM)) has nonvolatile characteristics, but has a DC current during a write operation, which leads to high power consumption; at the same time, a dynamic range of the resistive memory is generally narrow; and the ferroelectric memory, as a capacitive non-volatile memory, has very low write power consumption and wider dynamic range, and also has good CMOS technology compatibility, so that the ferroelectric memory is likely to become the next generation memory.

In a related art, the ferroelectric memory is mainly divided into a ferroelectric random access memory (FeRAM) and a ferroelectric field effect transistor (FeFET) memory. The read operation of the FeRAM needs to write the determined data into the memory device, which leads to the damage of the original data; and although the FeFET supports the non-destructive read operation, the write operation may generate excessive voltage inside the memory, which leads to short endurance of the write operation. Furthermore, the ferroelectric memory in the related art is difficult to take into account both the non-destructive read operation and the endurance of the write operation, which limits the full play of the advantages of the ferroelectric memory.

SUMMARY

In view of this, the present disclosure provides a memory device based on a ferroelectric capacitor, which can implement non-destructive reading of data and longer endurance of a write operation.

According to an aspect of the present disclosure, provided is a memory device based on a ferroelectric capacitor, comprising: a control unit and a plurality of memory cells arranged in an array, wherein the memory cell includes an external interface, a first switch, a transistor, a first capacitor and a second capacitor, the external interface includes a first word line, a second word line, a bit line, a first read terminal and a second read terminal, and at least one of the first capacitor and the second capacitor is a ferroelectric capacitor; the first switch includes a first port, a second port and a third port, the first port is connected with the first word line, the second port is connected with the bit line, and the third port is connected with one end of the first capacitor; the transistor includes a gate electrode, a source electrode and a drain electrode, the gate electrode is connected with the other end of the first capacitor and one end of the second capacitor respectively to form an internal node, the source electrode is connected with the first read terminal, the drain electrode is connected with the second read terminal, and the other end of the second capacitor is connected with the second word line, and the control unit is connected to the memory cell through the external interface and used to write data into the memory cell or read data from the memory cell.

In a possible implementation, the control unit writing data into the memory cell including: controlling a voltage of the first port of the first switch through the first word line, so that the second port and the third port of the first switch are connected to turn the first switch on; determining a voltage of the bit line according to a value of data to be written, and biasing the second word line to a first write voltage; and after biasing the second word line to the first write voltage, biasing the second word line to a second write voltage, so that a polarized state of the ferroelectric capacitor is consistent with the value of the data to be written, wherein the polarized state of the ferroelectric capacitor is used to indicate the value of the written data.

In a possible implementation, the control unit determining the voltage of the bit line according to the value of the data to be written including: determining whether the voltage of the bit line is at high level or low level when the data to be written is a single-bit value; and determining whether the voltage of the bit line is at high level, low level or intermediate level when the data to be written is a multi-bit value, wherein the intermediate level is higher than the low level and lower than the high level.

In a possible implementation, the control unit reading data from the memory cell including: biasing the first read terminal to a first read voltage, biasing the second read terminal to a second read voltage, and biasing the second word line to a third read voltage; after biasing the first read terminal to the first read voltage and biasing the second read terminal to the second read voltage, floating the second read terminal, and then biasing the first read terminal to a fourth read voltage, wherein the fourth read voltage is different from the second read voltage; and determining a value of the stored data in the memory cell according to a voltage change state of the second read terminal.

In a possible implementation, the control unit reading data from the memory cell further including: prior to biasing the second word line to the third read voltage, controlling the voltage of the first port of the first switch through the first word line, so that the second port and the third port of the first switch are disconnected to turn the first switch off.

In a possible implementation, the device includes at least one memory array, each memory array includes a plurality of memory cells, and for any memory array: the first word line and the second word line are arranged in a row direction of the memory array, and the bit line, the first read terminal and the second read terminal are arranged in a column direction of the memory array; or the first word line, the second word line and the second read terminal are arranged in the row direction of the memory array, and the bit line and the first read terminal are arranged in the column direction of the memory array.

According to another aspect of the present disclosure, provided is a memory device based on a ferroelectric capacitor, comprising: a control unit and a plurality of memory cells arranged in an array, wherein the memory cell includes an external interface, a first switch, a second switch, a first transistor, a first capacitor and a second capacitor, the external interface includes a first word line, a second word line, a third word line, a bit line, a first read terminal and a second read terminal, and at least one of the first capacitor and the second capacitor is a ferroelectric capacitor; the first switch includes a first port, a second port and a third port, the first port is connected with the first word line, the second port is connected with the bit line, and the third port is connected with one end of the first capacitor; the second switch includes a fourth port, a fifth port and a sixth port, the fourth port is connected with the third word line, and the sixth port is connected with the second read terminal; the first transistor includes a gate electrode, a source electrode and a drain electrode, the gate electrode is connected with the other end of the first capacitor and one end of the second capacitor respectively to form an internal node, the source electrode is connected with the first read terminal, and the drain electrode is connected with the fifth port of the second switch; the other end of the second capacitor is connected with the second word line; and the control unit is connected to the memory cell through the external interface and used to write data into the memory cell or read data from the memory cell.

In a possible implementation, the control unit writing data into the memory cell includes: controlling a voltage of the first port of the first switch through the first word line, so that the second port and the third port of the first switch are turned on; determining a voltage of the bit line according to a value of data to be written, and biasing the second word line to a first write voltage; after biasing the second word line to the first write voltage, biasing the second word line to a second write voltage, so that a polarized state of the ferroelectric capacitor is consistent with the value of the data to be written, wherein the polarized state of the ferroelectric capacitor is used to indicate the value of the written data.

In a possible implementation, the control unit reading data from the memory cell includes: controlling a voltage of the fourth port of the second switch through the third word line, so that the fifth port and the sixth port of the second switch are turned on; biasing the first read terminal to a first read voltage, biasing the second read terminal to a second read voltage, and biasing the second word line to a third read voltage; after biasing the first read terminal to the first read voltage, and biasing the second read terminal to the second read voltage, floating the first read terminal, and then biasing the second read terminal to a fifth read voltage, wherein the fifth read voltage is different from the first read voltage; and determining a value of the stored data in the memory cell according to a voltage change state of the first read terminal.

In a possible implementation, the control unit reading data from the memory cell further includes: prior to biasing the second word line to the third read voltage, controlling the voltage of the first port of the first switch through the first word line, so that the second port and the third port of the first switch are turned off.

In a possible implementation, the device includes at least one memory array, each memory array includes a plurality of memory cells, and for any memory array: the first word line, the second word line and the third word line are arranged in a row direction of the memory array, and the bit line, the first read terminal and the second read terminal are arranged in a column direction of the memory array; or the first word line, the second word line, the third word line and the second read terminal are arranged in the row direction of the memory array, and the bit line and the first read terminal are arranged in the column direction of the memory array.

A polarized state of the ferroelectric capacitor in a memory cell is held or changed based on hysteresis characteristics of the ferroelectric capacitor, a control unit is used to write data into or read data from the memory cell; and according to various aspects of the present disclosure, non-destructive reading of data and longer endurance of the write operation can be achieved.

Other features and aspects of the present disclosure may become apparent from the following detailed descriptions of exemplary embodiments with reference to the accompanying drawings.

BRIEF DESCRIPTION OF THE DRAWINGS

The accompanying drawings, which are incorporated in and constitute a part of the description, along with the description, illustrate exemplary embodiments, features and aspects of the present disclosure and are used to explain the principle of the present disclosure.

DETAILED DESCRIPTION

Figure 1:
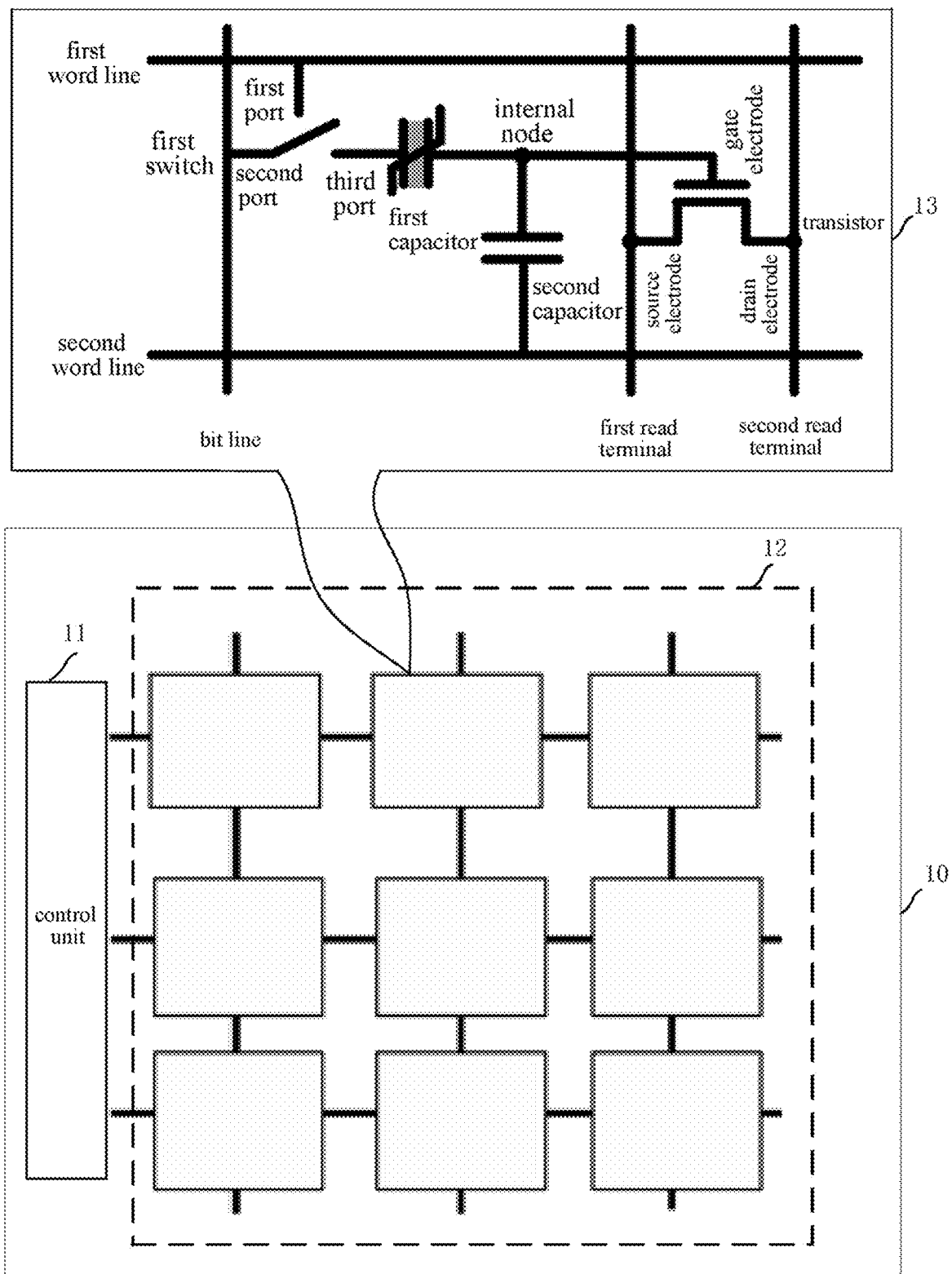
FIG. 1 illustrates a structural schematic diagram of a memory cell according to an embodiment of the present disclosure.

Various exemplary embodiments, features and aspects of the present disclosure are described in detail below with reference to the accompanying drawings. Same reference numerals in the drawings refer to elements with same or similar functions. Although various aspects of the embodiments are illustrated in the drawings, the drawings are unnecessary to draw to scale unless otherwise specified.

The term "exemplary" herein means "using as an example and an embodiment or being illustrative". Any embodiment described herein as "exemplary" should not be construed as being superior or better than other embodiments.

Furthermore, for better describing the present disclosure, numerous specific details are illustrated in the following detailed description. Those skilled in the art should understand that the present disclosure may be implemented without certain specific details. In some examples, methods, means, elements and circuits that are well known to those skilled in the art are not described in detail in order to highlight the main idea of the present disclosure.

The present disclosure relates to a memory device based on a ferroelectric capacitor. The memory device includes a control unit and at least one memory array. Each memory array includes a plurality of memory cells. The plurality of memory cells are arranged in an array. Each memory cell at least includes two capacitors, a switch and a transistor. At least one of the two capacitors is a ferroelectric capacitor. A polarized state of the ferroelectric capacitor may be used to indicate a value of data, and may be held or changed by the control unit. The polarized state of the ferroelectric capacitor in the memory cell is held or changed based on hysteresis characteristics of polarization intensity-port voltage of the ferroelectric capacitor, the control unit is used to write data into or read data from the memory cell, and the present disclosure can implement non-destructive reading of data and longer endurance of a write operation, and is high in reliability.

FIG. 1 illustrates a structural schematic diagram of a memory cell according to an embodiment of the present disclosure.

As shown in FIG. 1, the memory device 10 includes a control unit 11 and at least one memory array 12; the memory array 12 includes a plurality of memory cells 13 arranged in an array; the memory cell 13 may include an external interface, a first switch, a transistor, a first capacitor and a second capacitor; the external interface includes a first word line, a second word line, a bit line, a first read terminal and a second read terminal, and at least one of the first capacitor and the second capacitor is a ferroelectric capacitor; the first switch includes a first port, a second port and a third port, the first port is connected with the first word line, the second port is connected with the bit line, and the third port is connected with one end of the first capacitor; the transistor includes a gate electrode, a source electrode and a drain electrode, the gate electrode is connected with the other end of the first capacitor and one end of the second capacitor respectively to form an internal node, the source electrode is connected with the first read terminal, the drain electrode is connected with the second read terminal, and the other end of the second capacitor is connected with the second word line; and the control unit is connected to the memory cell through the external interface and used to write data into the memory cell or read data from the memory cell.

In a possible implementation, the memory device 10 includes a control unit 11 and at least one memory array 12, and the memory array 12 includes a plurality of memory cells 13 arranged in an array. The control unit is connected to the memory cell through the external interface and used to write data into the memory cell or read data from the memory cell. For example, the plurality of memory cells may constitute an array of 8×16 to form a memory array. The memory array includes 8 memory cells in a row direction and includes 16 memory cells in a column direction; and each memory cell may store 1 bit of data (i.e., "1" or "0" of a binary form), and the memory array may store the 8×16 bits of data in total.

In a possible implementation, the control unit writing data into the memory cell may include a write stage and a hold stage. For example, in an actual application, a whole row of the memory cells can be used to write data without column selection. Specifically, when the write operation is performed, a row in the memory array may be selected for read by adjusting the voltage of the first word line, and at the moment, the remaining rows in the memory array are not affected. For example, to perform reading on the memory cells located in a row A, the voltage of the first word line corresponding to the row A may be adjusted, so that the first switch is turned on; at the same time, the voltage of the first word lines of the remaining rows is adjusted, so that the first switch is turned off; and therefore, when the writing is performed on the row A, the remaining rows may not be affected. For the memory cells in the row A, because the voltage of the first word line makes the first switches of all memory cells in the row be in an on state, and 0/1 cannot be written simultaneously, different memory cells located in the row A may be in the write stage or the hold stage. For example, 1 may be first written into the memory cell to which 1 is to be written in the row A, and data-hold is performed on the memory cell to which 0 is to be written; and then 0 is written to the memory cell to which 0 is to be written in the row A, and at the same time, the data-hold is performed on the memory cell to which 1 has been written in the previous step. That is, when the write is performed on different memory cells of the same row, the write may be performed on some or all of the memory cells in the row. In a case where the write is performed on some of the memory cells in the row, the memory cells without data write in the row may be held in a pre-stored state.

In a possible implementation, the control unit writes data into the memory cell, and the hold stage and the write stage may occupy a clock cycle respectively. The clock cycle may be preset (such as 0.2 us). Those skilled in the art may understand that the duration of the clock cycle is not limited.

In a possible implementation, the first switch may include a transistor. For example, the first switch may be a metal-oxide-semiconductor field-effect transistor (MOSFET, abbreviated as MOS). For another example, the first switch may also be a junction field-effect transistor (JFET) or other types of switch devices. Those skilled in the art shall understand that the transistor in the memory cell may also include various types like the first switch, as long as the transistor has an on-off function. The type of the first switch and the transistor in the memory cell is not limited by the present disclosure.

In a possible implementation, the first switch and the transistor in the memory cell each may be MOSFET. Because the MOSFET may be either a N-channel NMOS or a P-channel PMOS, and the NMOS and the PMOS are different in turn-on and turn-off conditions, in the actual application, the NMOS or the PMOS may be used according to requirements to implement the first switch and the transistor in the memory cell. The positions of each port of the first switch and the transistor may also be different. The present disclosure is described below mainly by taking the first switch and the transistor in the memory cell that are the NMOS as an example.

In a possible implementation, the first switch includes a first port, a second port and a third port, the first port is connected with the first word line, the second port is connected with the bit line, and the third port is connected with one end of the first capacitor. For example, in a case where the first switch is the NMOS, the first port, the second port and the third port of the first switch may correspond to the gate electrode, the source electrode and the drain electrode of the MOSFET respectively. When the turn-on condition is satisfied (for example, the voltage of the gate electrode of the first switch is greater than a threshold voltage), the first switch is in an on state, that is, the voltage of the first port of the first switch may be controlled, so that the second port and the third port of the first switch are turned on. It should be noted that both the first capacitor and the second capacitor (such as the ferroelectric capacitor) may be a non-polarized capacitor, and the third port may be connected with any port of the first capacitor, which may not affect the implementation of the present disclosure. In FIG. 1, the third port of the first switch is connected with one end of the first capacitor (i.e., a left end of the first capacitor in FIG. 1).

In a possible implementation, the transistor includes a gate electrode, a source electrode and a drain electrode, the gate electrode is connected with the other end of the first capacitor (i.e., a right end of the first capacitor in FIG. 1) and one end of the second capacitor (i.e., an upper end of the second capacitor in FIG. 1) respectively to form an internal node, the source electrode is connected with the first read terminal, the drain electrode is connected with the second read terminal, and the other end of the second capacitor (i.e., a lower end of the second capacitor in FIG. 1) is connected with the second word line.

In a possible implementation, at least one of the first capacitor and the second capacitor is a ferroelectric capacitor. The ferroelectric capacitor may include a ferroelectric layer and two polar plates located at two sides of the ferroelectric layer. The two polar plates may be used as two ports of the ferroelectric capacitor to be connected to an external circuit. The ferroelectric layer may include a ferroelectric component composed of crystals with ferroelectric properties and a non-ferroelectric component such as impurities. On a micro basis, the ferroelectric may be a crystal with spontaneous polarization which can be redirected by an external electric field. Because positive and negative charge centers of unit cells in this kind of crystals are not overlapped, the unit cells have polarity. However, due to the periodicity and repeatability of a crystal structure, the intrinsic polarity of the unit cells may be in the same direction, which may lead to the crystal being in a highly polarized state. The polarized state does not need an external electric field, which is referred to as spontaneous polarization. Furthermore, a small area composed of adjacent unit cells in the same spontaneous polarization direction may be referred to as an electric domain, and the polarization characteristics of the ferroelectric are related to the movement of the electric domain under an action of the external electric field. When the external electric field changes periodically, there is a hysteresis characteristic between the polarization characteristics of the ferroelectric and the external electric field, which may be described by an electric hysteresis loop.

Figure 2:
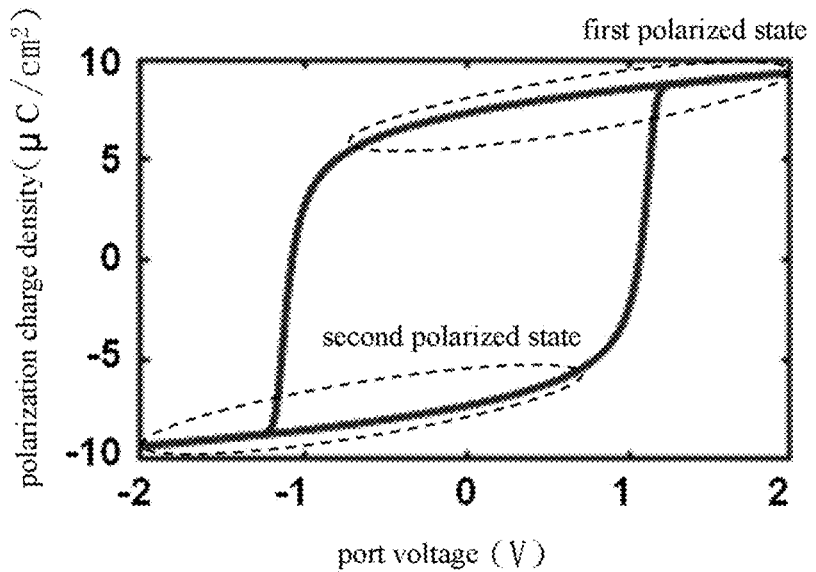
FIG. 2 illustrates a schematic diagram of an electric hysteresis loop of polarization charge density-port voltage of a ferroelectric capacitor according to an embodiment of the present disclosure.

FIG. 2 illustrates a schematic diagram of an electric hysteresis loop of polarization charge density-port voltage of a ferroelectric capacitor according to an embodiment of the present disclosure.

As shown in FIG. 2, there is the hysteresis characteristic between the polarization charge density of the ferroelectric capacitor and the port voltage of the ferroelectric capacitor. In FIG. 2, a horizontal axis indicates the port voltage of the ferroelectric capacitor in a unit of V (i.e., the voltage between the two ports of the ferroelectric capacitor), which indicates the external electric field acting on the ferroelectric capacitor; and a longitudinal axis indicates the polarization charge density of the ferroelectric capacitor (i.e., the polarization charge generated on a unit area of the ferroelectric capacitor) in a unit of $\mu C/cm^2$. Because the polarization charge density is related to the polarized state of the ferroelectric capacitor, the polarization charge density can represent the polarized state of the ferroelectric capacitor.

As shown in FIG. 2, in a possible implementation, the polarized state of the ferroelectric capacitor may include a first polarized state and a second polarized state. The first polarized state may also be referred to as a positive polarized state. In this state, the polarization charge density tends to be saturated with the increase of the port voltage of the ferroelectric capacitor; and the second polarized state may also be referred to as a negative polarized state, and in this state, the polarization charge density tends to be saturated with the increase of the reversed port voltage of the ferroelectric capacitor. Those skilled in the art should understand that different ferroelectric capacitors have different hysteresis characteristics because of factors such as technologies, raw materials and the like. The electric hysteresis loop of the polarization charge density-port voltage of the ferroelectric capacitor in FIG. 2 is exemplary, and the type of the ferroelectric capacitor is not limited by the present disclosure.

In a possible implementation, the polarized state of the ferroelectric capacitor may be used to indicate a value of data, and the value of the data may be "1" or "0" in a binary form. For example, in an embodiment of the present disclosure, the first polarized state of the ferroelectric capacitor may be used to indicate the binary digit "1", and the second polarized state of the ferroelectric capacitor may be used to indicate the binary digit "0". In a case where there is only one ferroelectric capacitor in the memory cell, the polarized state of the ferroelectric capacitor may also be regarded as the state of the whole memory cell. Each memory cell stores 1 bit of data "1" or "0". Those skilled in the art should understand that the present disclosure does not limit how to use the polarized state of the ferroelectric capacitor to indicate the data.

In a possible implementation, the control unit is connected to the memory cell through the external interface and used to write data into the memory cell or read data from the memory cell. For example, a global control unit may be configured in the whole memory device to control all the memory arrays in the memory device; and a plurality of memory arrays in the memory device may also be grouped, and each group is equipped with a control unit for more accurate read-write control. Furthermore, the memory device may also include other parts such as a power supply (such as a constant-voltage power supply), and other units of the memory device are not limited by the present disclosure.

In a possible implementation, the control unit writing data into the memory cell includes: controlling the voltage of the first port of the first switch by the first word line, so that the second port and the third port of the first switch are turned on; determining the voltage of the bit line according to the value of the data to be written, and biasing the second word line to the first write voltage so as to keep the ferroelectric capacitor of the memory cell in the polarized state before the data is written; after biasing the second word line to the first write voltage, biasing the second word line to the second write voltage, so that the polarized state of the ferroelectric capacitor is consistent with the value of the data to be written, wherein the polarized state of the ferroelectric capacitor is used to indicate the value of the written data.

In a possible implementation, the control unit determining the voltage of the bit line according to the value of the data to be written includes: when the data to be written is a single-bit value, determining whether the voltage of the bit line is high level or low level; and when the data to be written is a multi-bit value, determining whether the voltage of the bit line is high level, low level or intermediate level, wherein the intermediate level is higher than the low level and lower than the high level.

In an embodiment of the present disclosure, a specific process of writing the single-bit data into the memory cell by the control unit is described in detail below in conjunction with FIG. 3a and FIG. 3b.

Figure 3A:
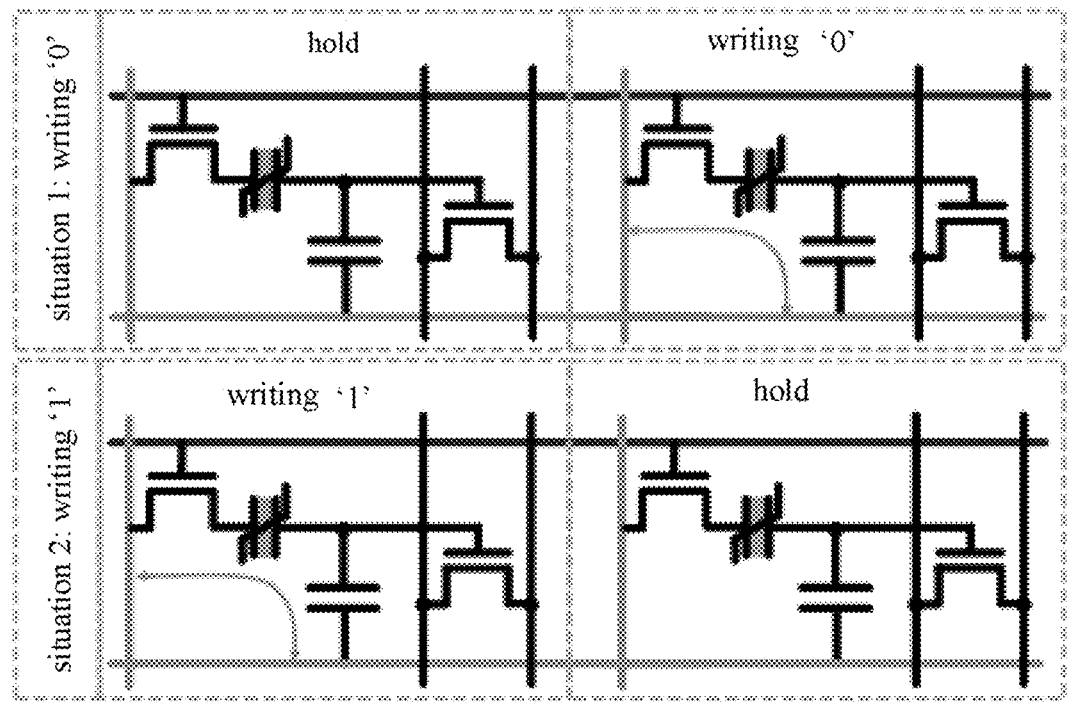
FIG. 3a illustrates a schematic diagram of a write operation of the memory cell according to an embodiment of the present disclosure.

FIG. 3a illustrates a schematic diagram of a write operation of the memory cell according to an embodiment of the present disclosure.

As shown in FIG. 3a, four memory cells are in four states of holding "0", writing "0", writing "1" and holding "1" respectively. Further, the control unit writes data into the memory cell, which may be divided into two situations: writing "1" and writing "0". The situation 1 may include two states: holding and writing "0", and the situation 2 may include two states: writing "1" and holding. It should be noted that in FIG. 3a, both the first switch and the transistor may be implemented by the NMOS; and the first capacitor may be the ferroelectric capacitor, and the second capacitor may be a conventional capacitor without ferroelectric property.

Figure 3B:
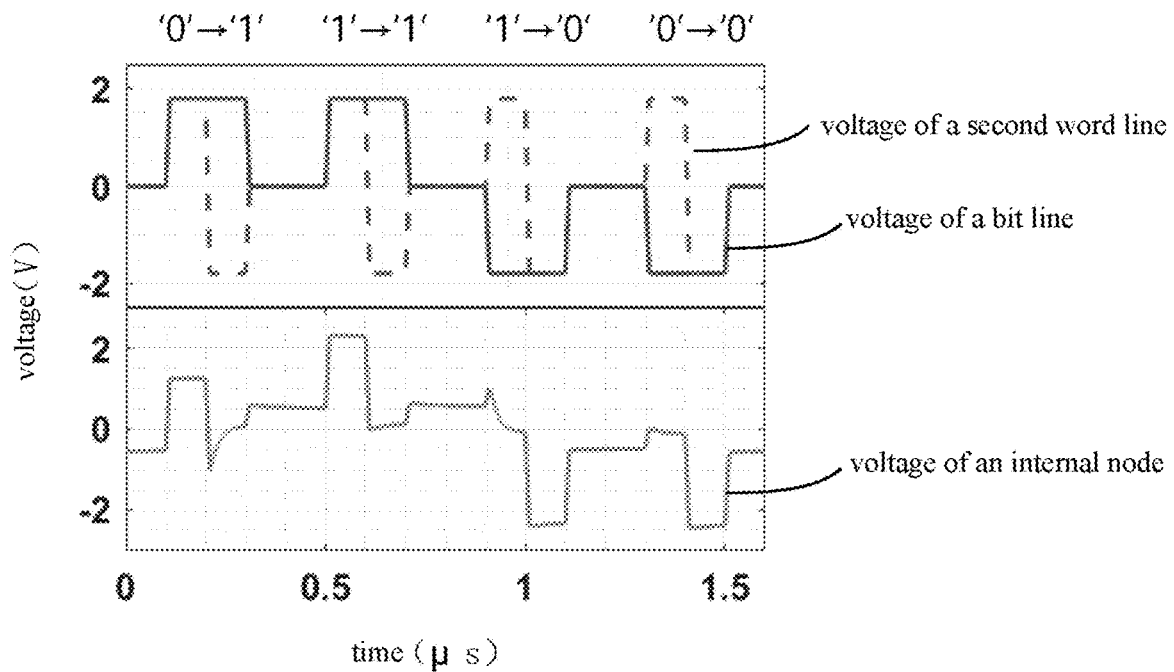
FIG. 3b illustrates a schematic diagram of a transient waveform of the write operation of the memory cell according to an embodiment of the present disclosure.

FIG. 3b illustrates a schematic diagram of a transient waveform of a write operation of the memory cell according to an embodiment of the present disclosure.

As shown in FIG. 3b, FIG. 3b may be the transient waveform of the memory cell in the write operation. The horizontal axis may indicate the time when the memory cell performs the write operation, in a unit of μs; and the longitudinal axis may indicate the voltage in a unit of V. Dot lines of an upper half part of FIG. 3b may indicate voltage change of the second word line in the write operation process, and solid lines of the upper half part of FIG. 3b may indicate the voltage change of the bit line in the write operation process; and solid lines of a lower half part may indicate the voltage change of the internal node in the write operation process. '0'→'1' may indicate that the value of the data pre-stored in the memory cell is rewritten from '0' to '1' (i.e., the data to be written), and other similar indications have the same meaning and are not repeated.

In a possible implementation, the voltage of the first port of the first switch is controlled by the first word line, so that the second port and the third port of the first switch are turned on. Referring to FIG. 3a, regardless of whether the value of the data written into the memory cell is "1" or "0", the voltage of the first word line (i.e., the voltage of the gate electrode of the switch) may be pre-adjusted, so that the first switch is in an on state, and the second port and the third port of the first switch are turned on. At the moment, the source electrode and the drain electrode of the first switch are equivalent to a short circuit, and the left end of the first capacitor is equivalent to being connected to the bit line directly. For example, in a case where the first switch is the NMOS, the voltage of the first word line may be biased at the preset turn-on voltage, to enable the first switch is in the on state. It should be noted that enabling the first switch to be in the on state is an operation performed by the control unit in a process of writing data into the memory cell; and when the memory cell is in a hold state (for example, after the data is written), the first switch may be in an off state (i.e., a turn-off state).

In a possible implementation, the voltage of the bit line is determined according to the value of the data to be written. For example, in a case where the value of the data to be written is 1, the voltage of the bit line is determined to be high level; and in a case where the value of the data to be written is 0, the voltage of the bit line is determined to be low level. Referring to FIG. 3b, in a case where the value of the data to be written is 1, the voltage of the bit line may be biased at $+V_w$ (such as +1.75V); and in a case where the value of the data to be written is 0, the voltage of the bit line may be biased at $-V_w$ (such as −1.75V). Symbols "+" and "−" may be relative to the ground (i.e., a reference zero potential), and when the voltage is greater than the reference zero potential, the symbol of the voltage is positive; and when the voltage is less than the reference zero potential, the symbol of the voltage is negative. It should be noted that the voltage of the bit line is exemplary, and the voltage of the bit line corresponding to different situations may be set in different embodiments, which is not limited by the present disclosure.

In a possible implementation, while the voltage of the bit line is determined according to the value of the data to be written, the second word line may be biased to the first write voltage. The first write voltage may be high level (such as $+V_w$), that is, in a case where the value of the data to be written is 1, the voltage of the bit line and the voltage of the second word line may be biased at the same voltage; and in a case where the value of the data to be written is 0, the voltage of the bit line and the voltage of the second word line may be biased at different voltages, and at the time, the voltage of the bit line and the voltage of the second word line are different in symbols but have the same absolute value.

Referring to FIG. 3b, in a case where the value of the data to be written is 0, the voltage of the bit line is biased to the low level −1.75V from 0, and the voltage of the second word line is biased to the high level +1.75V (i.e., the first write voltage) from 0. Because the first switch is already in the on state, the bit line and the left end of the first capacitor are equivalent to the short circuit; and therefore, the voltage of the left end of the first capacitor is also the low level −1.75V.

There are a lot of factors affecting the voltage of the right end of the first capacitor, which is mainly affected by the circuit structure and the hysteresis characteristics of the first capacitor. In FIG. 3b, on the one hand, because the value of the data pre-stored in the memory cell is 0, the voltage of −0.5V may be generated at the internal node, and the transistor is in an off state; therefore, a branch where the first capacitor is located and a branch where the second capacitor is located are equivalent to parallel connection for dividing the voltage; and on the other hand, the value of the data pre-stored in the memory cell may be 1 or 0. Because the first capacitor has the hysteresis characteristics, even if the bit line and the second word line have the same voltage change, for different values of the data pre-stored in the memory cell, the voltage change of the internal node may also be different.

For example, in FIG. 3b, in the process of writing the data stored in the memory cell from '1' to '0', after the voltage of the bit line is biased to the low level −1.75V from 0, and the voltage of the second word line is biased to the high level +1.75V from 0, the voltage of the internal node rises slightly from 0.5V to 1V, and then nonlinearly changed to 0V after half a clock cycle, due to the influence of the hysteresis characteristics of the first capacitor; and in the process of writing data stored in the memory cell from '0' to '0', after the voltage of the bit line is biased to the low level −1.75V from 0, and the voltage of the second word line is biased to the high level +1.75V from 0, the voltage of the internal node rises slightly from −0.5V to 0V and held for half a clock cycle, due to the influence of the hysteresis characteristics of the first capacitor.

Further referring to FIG. 3b, in a case where the value of the data to be written is 1, the voltage of the bit line is biased to the high level +1.75V from 0, and the voltage of the second word line is biased to the high level +1.75V (i.e., the first write voltage) from 0. Because the first switch is already in the on state, the bit line and the left end of the first capacitor are equivalent to the short circuit; and therefore, the voltage of the left end of the first capacitor is also the high level +1.75V.

Similar to the situation of writing "0", the voltage of the right end of the first capacitor is mainly affected by the circuit structure and the hysteresis characteristics of the first capacitor. In FIG. 3b, on the one hand, because the value of the data pre-stored in the memory cell is 1, the voltage of 0.5V may be generated at the internal node and cannot reach the threshold voltage of the transistor, and the transistor is still in an off state; therefore, the branch where the first capacitor is located and the branch where the second capacitor is located are equivalent to the parallel connection for dividing the voltage; and on the other hand, the value of the data pre-stored in the memory cell may be 1 or 0. Because the first capacitor has the hysteresis characteristics, even if the bit line and the second word line have the same voltage changes, for different values of the data pre-stored in the memory cell, the voltage change of the internal node may also be different.

For example, in FIG. 3b, in the process of writing the data stored in the memory cell from '0' to '1', after the voltage of the bit line is biased to the high level +1.75V from 0, and the voltage of the second word line is biased to the high level +1.75V from 0, the voltage of the internal node rises from −0.5V to 1.25V due to the influence of the hysteresis characteristics of the first capacitor; and in the process of writing the data stored in the memory cell from '1' to '1', after the voltage of the bit line is biased to the high level +1.75V from 0, and the voltage of the second word line is biased to the high level +1.75V from 0, the voltage of the internal node rises from 0.5V to 2.25V due to the influence of the hysteresis characteristics of the first capacitor.

In a possible implementation, after the second word line is biased to the first write voltage, the second word line is biased to the second write voltage, so that the polarized state of the ferroelectric capacitor is consistent with the value of the data to be written, wherein the polarized state of the ferroelectric capacitor is used to indicate the value of the written data. For example, the second write voltage may be the low level (such as −V_w). It should be noted that a time interval between biasing the second word line to the second write voltage and biasing the second word line to the first write voltage may be half a clock cycle, that is, the second word line is biased to the first write voltage and may be held for half a clock cycle first, and then the second word line is biased to the second write voltage and held for half a clock cycle, occupying one clock cycle in total. In one clock cycle occupied by the second word line, the voltage of the bit line may be kept unchanged, i.e., kept at the low level or the high level.

In a possible implementation, for the memory cell that is first in the write stage and then in the hold stage, after the second word line is biased to the first write voltage, the polarized state of the ferroelectric capacitor begins to change to the polarized stage consistent with the value of the data to be written; and for the memory cell that is first in the hold stage and then in the write stage, after the second word line is biased to the second write voltage, the polarized state of the ferroelectric capacitor begins to change to the polarized state consistent with the value of the data to be written. That is, a time node when the ferroelectric capacitor in the memory cell begins to change the polarized state may be determined according to the current state or stage of the memory cell.

Referring to FIG. 3b, in a case where the value of the data to be written is 0, for the process of writing data into the memory cell from '1' to '0', the voltage of the second word line may be pulled down from the first write voltage +1.75V to the second write voltage −1.75V at a time of 1 us and held for half a clock cycle (such as 0.1 us), and at the moment, the voltage of the left end of the first capacitor is still −1.75V; the voltage of the left end of the first capacitor is low, and the voltage of the right end is high, so that the first capacitor begins to change the polarized state from the first polarized state to the second polarized state, and the voltage of the internal node is pulled down from 0 to −2.25V and also held for half a clock cycle; for the process of writing data into the memory cell from '0' to '0', the voltage of the second word line may be pulled down from the first write voltage +1.75V to the second write voltage −1.75V at a time of 1.4 us and held for half a clock cycle (such as 0.1 us), and at the moment, the voltage of the left end of the first capacitor is still −1.75V; and because of the hysteresis characteristics of the first capacitor, the polarized state of the first capacitor is kept unchanged, and the voltage of the internal node is pulled down from 0 to −2.25V and also held for half a clock cycle.

Further referring to FIG. 3b, in a case where the value of the data to be written is 1, for the process of writing data into the memory cell from '0' to '1', the voltage of the second word line may be pulled down from the first write voltage +1.75V to the second write voltage −1.75V at a time of 0.2 us and held for half a clock cycle (such as 0.1 us), and at the moment, the voltage of the left end of the first capacitor is still +1.75V; the voltage of the left end of the first capacitor is high, and the voltage of the right end is low, so that the first capacitor starts to change the polarized state from the second polarized state to the first polarized state, and the voltage of the internal node is pulled down from 1.25V to −1V and nonlinearly changed to 0V in half a clock cycle; for the process of writing data into the memory cell from '1' to '1', the voltage of the second word line may be pulled down from the first write voltage +1.75V to the second write voltage −1.75V at a time of 1.4 us and held for half a clock cycle (such as 0.1 us), and at the moment, the voltage of the internal node is pulled down from 2.25V to 0V; the voltage of the left end of the first capacitor is still +1.75V; and because of the hysteresis characteristics of the first capacitor, the first capacitor is kept unchanged in the first polarized state.

In a possible implementation, after the second word line is biased to the second write voltage, the second word line may also be biased to the hold voltage. The hold voltage may be 0V. For example, in FIG. 3b, after the second word line is biased to the second write voltage −1.75V, the second word line may be pulled up to 0V from −1.75V after half a clock cycle. At the moment, in the process of writing data into the memory cell from '0' to '1', the voltage of the internal node rises from 0 to 0.5V, which indicates that the process of changing the first capacitor from the second polarized state to the first polarized state is ended; in the process of writing data into the memory cell from '1' to '1', the voltage of the internal node rises from 0 to 0.5V, which indicates that the first capacitor is still kept in the first polarized state; in the process of writing data into the memory cell from '1' to '0', the voltage of the internal node is pulled up from −2.25V to −0.5V, which indicates of changing the first capacitor from the first polarized state to the second polarized state is ended; and in the process of writing data into the memory cell from '0' to '0', the voltage of the internal node is pulled up from −2.25V to −0.5V, which indicates that the first capacitor is still kept in the second polarized state.

In a possible implementation, while the second word line is biased to the hold voltage, the voltage of the bit line may be biased to the hold voltage (such as 0V). In a case where the value of the data to be written is 0, the bit line may be biased to 0V from the negative high voltage; and in a case where the value of the data to be written is 0, the bit line may be biased to 0V from the positive high voltage. Because the polarized state of the first capacitor is already consistent with the value of the data to be written, the voltage of the bit line is biased to the hold voltage, so that the first switch can be in a turn-off state, thereby preventing the turn-on of the first switch from affecting the data-hold when the memory cell is in the hold state, and also saving the electric quantity.

In a possible implementation, after the second word line is biased to the hold voltage, the polarized state of the first capacitor is kept unchanged. It should be noted that the data in the memory cell does not need to be changed all the time, so that the hold time of the data in the memory cell may be an integer multiple of the clock cycle. It may be seen from FIG. 3a that one memory cell may be alternately in the state of writing 0 or 1 and in the hold state; and it may be seen from FIG. 3b that the time for writing 0 or 1 into the memory cell may be equal to the time for holding data, both of which may be a clock cycle (i.e., 0.2 us).

It should be noted that in the situation 1 and the situation 2 of FIG. 3a, the write part and the hold part do not have any sequential relationship. Those skilled in the art shall understand that whether the memory cell is written or held first, or whether the memory cell is in the hold state or the write state can be determined according to a preset instruction, which is not limited by the present disclosure. Furthermore, when the memory cell performs the write operation, the transistor in FIG. 1 may be in the turn-off state, and the first read terminal and the second read terminal may not affect the write of data.

In a possible implementation, when the data to be written is a multi-bit value, whether the voltage of the bit line is high level, low level or intermediate level is determined, wherein the intermediate level is higher than the low level and lower than the high level. For example, two bits of data may be written to the memory cell: 00, 01, 10 and 11, and there are four states in total. In a case where the value of the data is 10, the voltage of the bit line may be biased to half of the voltage of the bit line (such as the intermediate level $V_H/2$) in a single-bit situation, and at the moment, the voltage of the second word line may be kept unchanged, so that the polarization degree of the ferroelectric capacitor is adjusted. For another example, in a case where the value of the data is 10, the voltage of the bit line and the voltage of the second word line may also be adjusted simultaneously so as to change the polarization degree of the ferroelectric capacitor. Furthermore, the polarization degree of the ferroelectric capacitor may also be adjusted by different voltage biasing time of the bit line and the second word line. In the case of multiple bits, the voltage of the internal node may be 0.5V, −0.5V or a value between −0.5V and 0.5V. For the three kinds of data: 00, 01 and 11, the polarization degree of the ferroelectric capacitor may also be adjusted by the above method. That is, writing multi-bit data into the memory cell may be implemented by adjusting the polarization degree of the ferroelectric capacitor. Those skilled in the art should understand that the polarization degree of the ferroelectric capacitor is related to the voltage of two ends of the ferroelectric capacitor, and a purpose of writing the multi-bit data in the embodiment of the present disclosure may be achieved by changing the polarization degree of the ferroelectric capacitor in any way. How to change the polarization degree of the ferroelectric capacitor is not limited by the present disclosure.

Furthermore, the voltage of the second word line may also be kept unchanged during the whole write process, regardless of whether single-bit data or multi-bit data is written. After the second word line is biased to the first write voltage, the second word line may not be biased to the second write voltage and may be always kept unchanged. At the moment, the memory cell can implement the write operation without being divided into the hold stage and the write stage.

According to the above embodiment of the present disclosure, the voltages of the bit line, the first word line and the second word line are configured according to the value of the data to be written, so that the voltages of two ends of the ferroelectric capacitor in the memory cell are changed, then the polarized state of the ferroelectric capacitors is changed or held, and the value of the data to be written is written into the memory cell; and compared with the related art, excessive voltage may not be generated inside the memory cell, and the endurance of the write operation is prolonged.

In a possible implementation, the control unit reading data from the memory cell includes: biasing the first read terminal to the first read voltage, biasing the second read terminal to the second read voltage, and biasing the second word line to a third read voltage; after biasing the first read terminal to the first read voltage and biasing the second read terminal to the second read voltage, floating the second read terminal, and then biasing the first read terminal to a fourth read voltage, wherein the fourth read voltage is different from the second read voltage; and determining the value of the stored data in the memory cell according to the voltage change state of the second read terminal.

In the embodiment of the present disclosure, a specific process of reading data from the memory cell by the control unit is described in detail below in conjunction with FIG. 4a and FIG. 4b. It should be noted that in FIG. 4a, the first read voltage is the same as the second read voltage, which is exemplary. In the actual application, the first read voltage and the second read voltage may also be different.

Figure 4A:
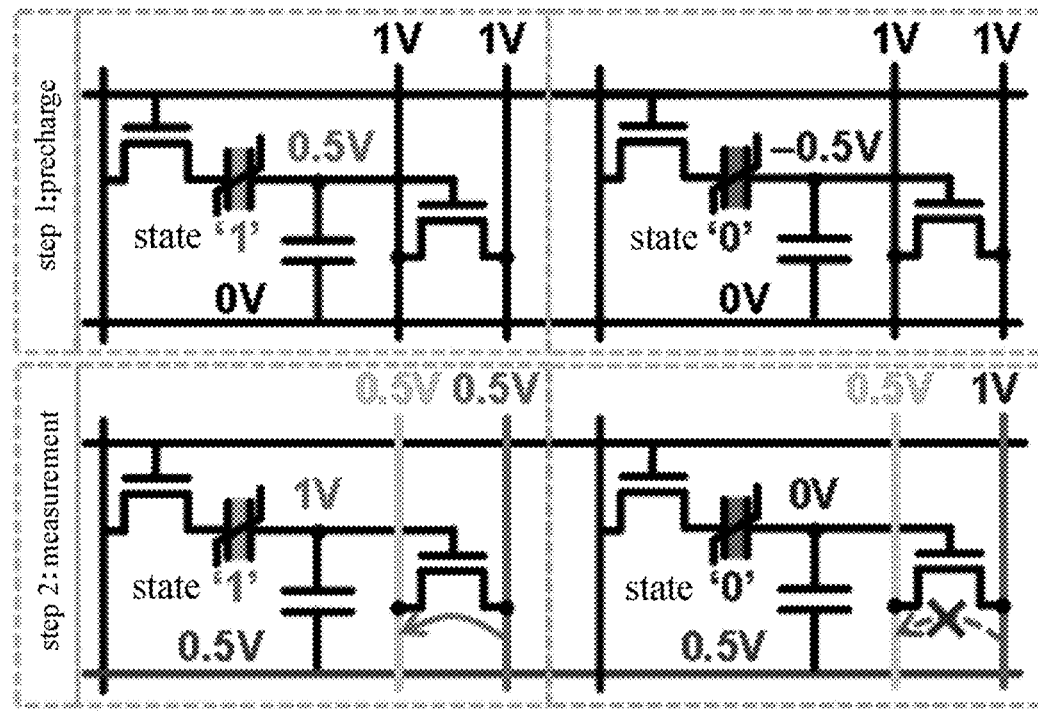
FIG. 4a illustrates a schematic diagram of a read operation of the memory cell according to an embodiment of the present disclosure.

FIG. 4a illustrates a schematic diagram of a read operation of the memory cell according to an embodiment of the present disclosure.

As shown in FIG. 4a, in a possible implementation, the control unit may read data from the memory cell. Like FIG. 3a, in FIG. 4a, both the first switch and the transistor may be implemented by the NMOS; and the first capacitor may be the ferroelectric capacitor, and the second capacitor may be a conventional capacitor without ferroelectric property.

In a possible implementation, the voltage of the first port of the first switch is controlled by the first word line, so that the second port and the third port of the first switch are disconnected so as to keep the polarized state of the ferroelectric capacitor before the read operation performed on the data. For example, before the read operation is performed on the memory device, the memory cell may be in the hold state, at the moment, both the bit line and the second word line may be biased at 0V, and the first switch is turned off. Furthermore, in a case where the data stored in the memory cell is '1', the voltage of the internal node may be 0.5V, and in a case where the data stored in the memory cell is '0', the voltage of the internal node may be −0.5V.

In a possible implementation, both the first read terminal and the second read terminal are biased to the first read voltage, and the second word line is biased to the third read voltage. Referring to FIG. 4a, the first read voltage may be 1V, and the third read voltage may be 0.5V. The process of biasing both the first read terminal and the second read terminal to the first read voltage may also be referred to as a pre-charge process, i.e., a step 1 in FIG. 4a; and the process of biasing the second word line to the third read voltage may also be referred to as a measurement process, i.e., a step 2 in FIG. 4a. It should be noted that the step 1 in FIG. 4a may be executed before the step 2 or at the same time with the step 2, which is not limited by the present disclosure.

Referring to FIG. 4a, after both the first read terminal and the second read terminal are biased to the first read voltage, the source electrode and the drain electrode of the transistor are equipotential, the voltage of the internal node is 0.5V or −0.5V, which cannot make the transistor turned on; and the transistor is still in an off state. At the moment, the first switch is also in the off state, so that the voltage of the internal node may change synchronously with the voltage of the second word line. Because the voltage of the second word line is 0V in the hold state, the voltage of the internal node is 0.5V or −0.5V, and there is a potential difference of 0.5V between the voltages of the second word line and the internal node; therefore, in a case where the second word line is biased to 0.5V (i.e., the third read voltage) from 0V, if the data stored in the memory cell is '1', the voltage of the internal node may be pulled up from 0.5V to 1V as the second word line is pulled up, at the moment, the transistor is in an on state, and the second read terminal and the first read terminal are equivalent to the short circuit; and if the data stored in the memory cell is '0', the voltage of the internal node may be pulled up from −0.5V to 0V as the second word line is pulled up, at the moment, the transistor is still in the off state, and the second read terminal and the first read terminal are equivalent to an open circuit.

In a possible implementation, after the first read terminal is biased to the first read voltage, and the second read terminal is biased to the second read voltage, the second read terminal is floated, and the first read terminal is biased to the fourth read voltage, where the fourth read voltage is different from the second read voltage; and the value of the stored data in the memory cell is determined according to the voltage change state of the second read terminal. For example, the fourth read voltage may be preset to 0.5V, which is less than the second read voltage (such as 1V). After the first read terminal is discharged to the fourth read voltage, if the data stored in the memory cell is '1', at the moment, the transistor is in the on state, and the second read terminal and the first read terminal are equivalent to the short circuit, so that the voltage of the second read terminal may also be pulled down to the fourth read voltage 0.5V; and if the data stored in the memory cell is '0', at the moment, the transistor is still in the off state, and the second read terminal and the first read terminal are equivalent to the open circuit, so that the voltage of the second read terminal may be held at the second read voltage 1V. Therefore, the value of the stored data in the memory cell can be judged by measuring whether the voltage of the second read terminal changes from the second read voltage to the fourth read voltage.

In a possible implementation, the first read terminal is biased to the fourth read voltage, which may be implemented by using a constant-voltage power supply, that is, the first read terminal is connected to the constant-voltage power supply. Considering the difficulty in directly designing a constant-voltage power supply for inflow current, the first read terminal is connected to the constant-voltage power supply, which can charge and then discharge the first read terminal simply and conveniently, and then the voltage of the internal node is judged by observing whether the voltage of the second read terminal changes, so as to judge the polarized state of the first capacitor, and finally determine whether the value of the stored data in the memory cell is '0' or '1'. How to bias the first read terminal to the fourth read voltage is not limited by the present disclosure.

In a possible implementation, in a case where the transistor is an NMOS, when the voltage of the second read terminal is in a first voltage range corresponding to the first read voltage, the value of the stored data is 0; and when the voltage of the second read terminal is in a second voltage range corresponding to the third read voltage, the value of the stored data is 1. For example, the first voltage range may be set to 0.4V-0.8V, and when the voltage of the second read terminal is in the first voltage range, the value of the stored data may be determined to 0; and the second voltage range may be set to 0.8V-1.2V, and when the voltage of the second read terminal is in the second voltage range, the value of the stored data may be determined to be 1.

In a possible implementation, the control unit reading data from the memory cell further includes: before biasing the second word line to the third read voltage, controlling the voltage of the first port of the first switch by the first word line, so that the second port and the third port of the first switch are disconnected. It should be noted that when the first switch is in the on state, the control unit can also read data from the memory cell.

The value of the stored data in the memory cell is judged according to whether the second read terminal is in the first voltage range or the second voltage range, so that the voltage fluctuation caused by external factors can be reduced, the misjudgment on the stored data in the memory cell is avoided, and the accuracy of data reading is improved.

According to the above embodiment of the present disclosure, the polarized state of the ferroelectric capacitor stored in the memory cell is judged by measuring the voltage change of the second read terminal, so that the value of the stored data in the memory cell is determined to implement data reading; and compared with the related art that the specific data needs to be written during the read operation, the damage of the original data may be avoided, and the accuracy of data reading is improved.

Figure 4B:
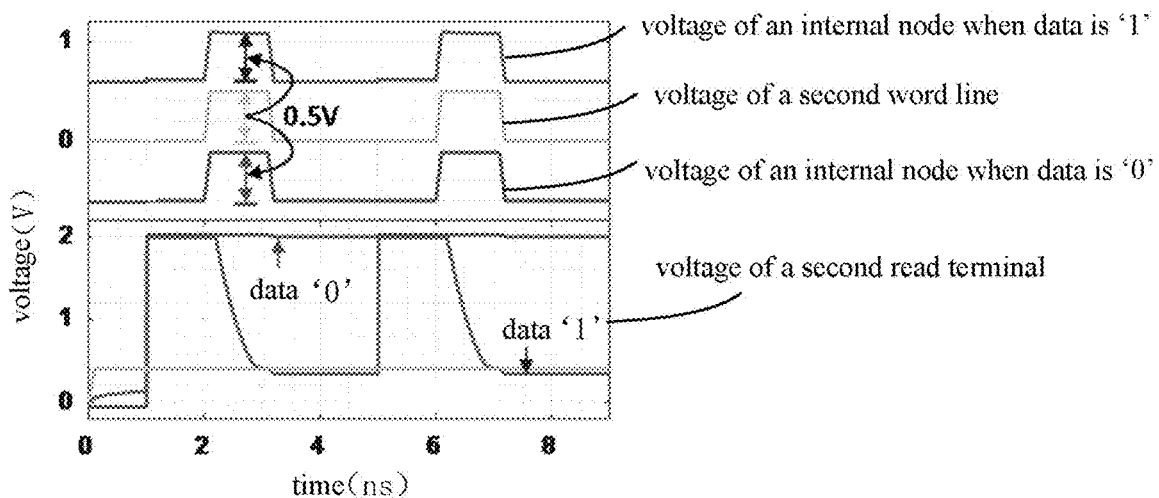
FIG. 4b illustrates a schematic diagram of a transient waveform of a read operation of the memory cell according to an embodiment of the present disclosure.

FIG. 4b illustrates a schematic diagram of a transient waveform of a read operation of the memory cell according to an embodiment of the present disclosure.

As shown in FIG. 4b, the horizontal axis may indicate the read operation time of the memory cell in a unit of ns; and the longitudinal axis may indicate the voltage in a unit of V. FIG. 4b may be divided into an upper diagram and a lower diagram. At the upper half part, three curves from top to bottom indicate the voltage of the internal node when the value of the data is 1, the voltage of the second word line, and the voltage of the internal node when the value of the data is 0 in sequence; and at the lower half part, the curve indicates the voltage of the second read terminal.

Referring to FIG. 4b, for the upper half part, at the moment 0, the memory cell is in the hold state. At the moment, the voltage of the second word line is 0V; if the value of the stored data in the memory cell is 1, the voltage of the internal node may be 0.5V; and if the value of the stored data in the memory cell is 0, the voltage of the internal node may be −0.5V, that is, there is a potential difference of 0.5V between every two of the three curves of the upper half part.

Further referring to FIG. 4b, when the stored data in the memory cell is read, the voltage of the first word line may be adjusted to turn off the first switch; and the second word line is biased at 0V, and when the time is 1 ns, both the first read terminal and the second read terminal are recharged to 2V. Next, the voltage of the second word line is biased at 0.5V, and then the voltage of the first read terminal is discharged from 2V to 0.5V. If the value of the stored data in the memory cell is '1', the voltage of the internal node is pulled up from 0.5V to 1V, the transistor is turned on, and at the moment, the voltage of the second read terminal drops to 0.5V with the voltage of the first read terminal; and if the value of the stored data in the memory cell is '0', the voltage of the internal node is pulled down from 0.5V to 0V, the transistor is still turned off, and at the moment, the voltage of the second read terminal is still kept at 2V.

In a possible implementation, the polarized state of the ferroelectric capacitor stored in the memory cell may also be judged by measuring the current change of the second read terminal, so that the data reading is implemented by determining the value of the stored data in the memory cell. For example, the first read terminal may be configured to change from a larger current to a smaller current, and then the polarized state of the ferroelectric capacitor stored in the memory cell is judged by measuring the current change of the second read terminal; and the working principle is similar to that of judging the polarized state of the ferroelectric capacitor stored in the memory cell by measuring the voltage change of the second read terminal, which is not repeated.

In a possible implementation, the control unit reads the data from the memory cell, which may be divided into two situations: reading the single-bit value and reading the multi-bit value. In a case where the value of the stored data in the memory cell is the single-bit value, the voltage change state of the second read terminal may be divided into two situations: unchanged and changed, corresponding to two polarized states of the ferroelectric capacitor under the single-bit value; and in a case where the value of the stored data in the memory cell is the multi-bit value, the voltage change state of the second read terminal may have various situations according to a change rate of the voltage or current, corresponding to various polarized states of the ferroelectric capacitor under the multi-bit value. For example, in a case where the multi-bit value is 00, 10, 01 and 11, if the voltage of the second read terminal is kept at 1V, it may indicate that the value of the stored data in the memory cell is 11; if the time for the voltage of the second read terminal dropping from 1V to 0.5V is 3 ns, it may indicate that the value of the stored data in the memory cell is 10; if the time for the voltage of the second read terminal dropping from 1V to 0.5V is 2 ns, it may indicate that the value of the stored data in the memory cell is 01; and if the time for the voltage of the second read terminal dropping from 1V to 0.1V is 1 ns, it may indicate that the value of the stored data in the memory cell is 00. Furthermore, the polarization degree of the ferroelectric capacitor may be judged according to the difference between the drop amplitudes of the voltage or current of the second read terminal, and so on. Those skilled in the art should understand that there are various methods for judging the polarization degree of the ferroelectric capacitor, and for example, the stored data may also be judged according to the rising rate of the voltage of the second read terminal; and how to judge the polarization degree of the ferroelectric capacitor and to further read the stored multi-bit value in the memory cell is not limited by the present disclosure.

Figure 5:
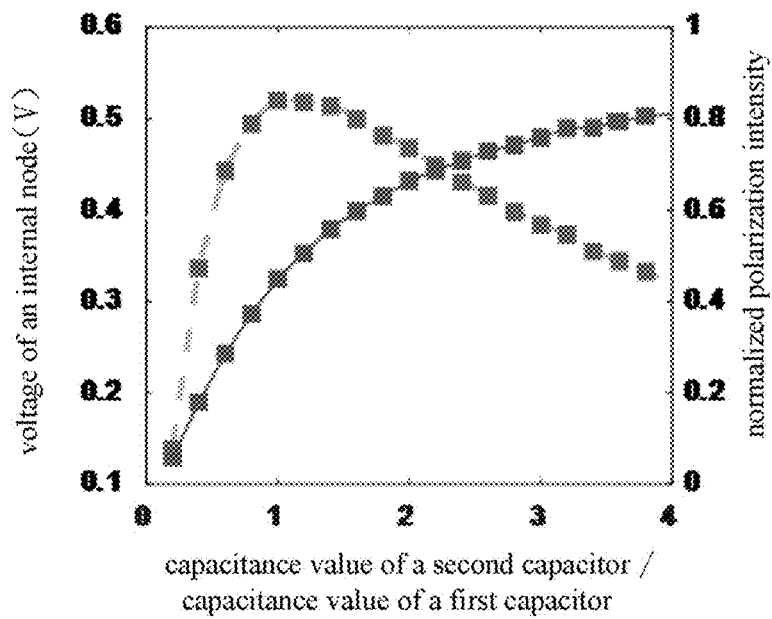
FIG. 5 illustrates a schematic diagram of a relationship between voltage of an internal node and polarization intensity of a ferroelectric capacitor and a capacitance ratio of a second capacitor and a first capacitor according to an embodiment of the present disclosure.

FIG. 5 illustrates a schematic diagram of a relationship between voltage of an internal node and polarization intensity of a ferroelectric capacitor and a capacitance ratio of a second capacitor and a first capacitor according to an embodiment of the present disclosure.

As shown in FIG. 5, the horizontal axis indicates a ratio of the capacitance of the second capacitor to the capacitance of the first capacitor (i.e., the capacitance ratio), and the left longitudinal axis indicates the voltage of the internal node in a unit of V; and the right longitudinal axis indicates the normalized polarization intensity of the ferroelectric capacitor. The ferroelectric capacitor may be the first capacitor.

Referring to FIG. 5, for different ratios of the capacitance of the second capacitor to the capacitance of the first capacitor, the voltage of the internal node and the polarization intensity of the ferroelectric capacitor may also be different. For example, when the capacitance of the second capacitor is equal to the capacitance of the first capacitor, the voltage of the internal node is approximate to the maximum value; and as the ratio of the capacitance of the second capacitor to the capacitance of the first capacitor increases gradually, the normalized polarization intensity of the ferroelectric capacitor also increases gradually and tends to be saturated. It should be noted that the curve in FIG. 5 may correspond to the memory cell of FIG. 1, and for different variations of the memory cell, the curve in FIG. 5 may also be different. In the actual application, the ratio of the capacitance of the second capacitor to the capacitance of the first capacitor may be adjusted according to the requirement; and for example, an area of the second capacitor and an area of the first capacitor may be adjusted when the circuit is designed, so that the capacitance of the second capacitor and the capacitance of the first capacitor are adjusted to make the voltage of the internal node reach a suitable value, thereby achieving the optimal performance of the memory cell. In an example, the ratio of the capacitance of the second capacitor to the capacitance of the first capacitor may be 2:1.

According to the embodiment of the present disclosure, the voltage of the internal node (i.e., the potential difference between the internal node and the second word line) corresponding to different data to be written can be adjusted by adjusting the relative magnitude of the capacitance of the first capacitor to the capacitance of the second capacitor in the memory cell; when the transistor is turned off, the voltage of the internal node is changed synchronously by changing the voltage of the second word line, so that the resistance value between the source electrode and the drain electrode of the transistor corresponding to different data to be written is adjusted to obtain an ideal ratio of the turn-on resistance to the turn-off resistance between the source electrode and the drain electrode, thereby implementing the nondestructive reading without affecting the polarized state of the ferroelectric capacitor, and reducing the time delay and energy consumption of the read operation.

Figure 6:
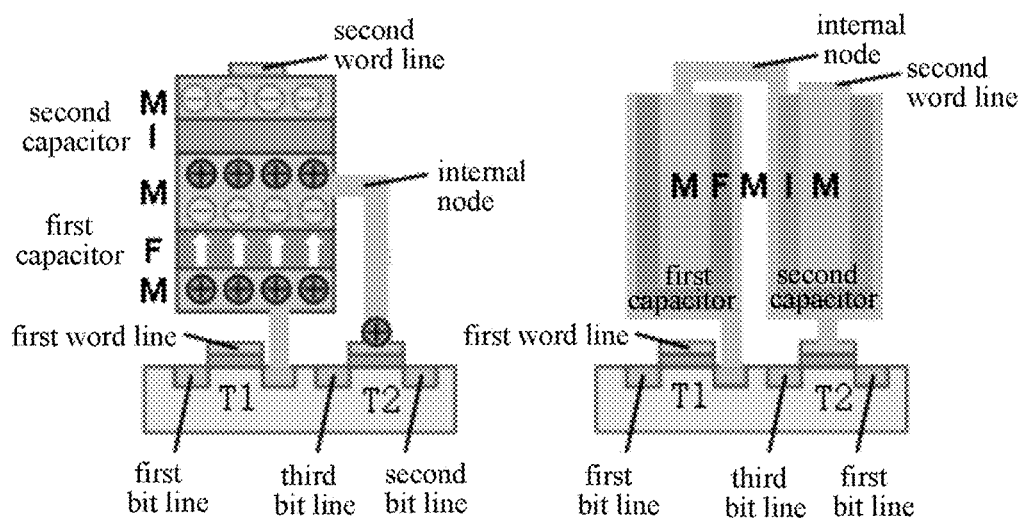
FIG. 6 illustrates a schematic diagram of a physical structure of the memory cell according to an embodiment of the present disclosure.

FIG. 6 illustrates a schematic diagram of a physical structure of the memory cell according to an embodiment of the present disclosure.

As shown in FIG. 6, M indicates a metal layer, I indicates an ordinary dielectric layer, F indicates a ferroelectric dielectric layer, T1 indicates a first switch, and T2 indicates a transistor. In an example, T1 may also be a transistor.

Referring to FIG. 6, at the left half part of FIG. 6, the ordinary dielectric layer I and two adjacent metal layers M may form the second capacitor together (such as the ordinary capacitor without ferroelectric property); the ferroelectric dielectric layer F and two adjacent metal layers M may form the first capacitor together (such as the ferroelectric capacitor); one end of the first capacitor is connected with the drain electrode of the first switch T1 (such as the NMOS), and one end of the second capacitor is connected with the other end of the first capacitor to form the internal node together; and the internal node is connected with the gate electrode of the transistor T2. The first bit line is connected with the source electrode of the first switch T1, the second bit line is connected with the drain electrode of the transistor T2, and the third bit line is connected with the source electrode of the transistor T2; and the first word line is connected with the gate electrode of the first switch T1, and the second word line is connected with one end of the second capacitor. The right half part of FIG. 6 is similar to the left half part, which is not repeated. It should be noted that both the first capacitor and the second capacitor may be implemented by adopting a planar structure, or may be implemented by adopting a stereostructure.

Figure 7A:
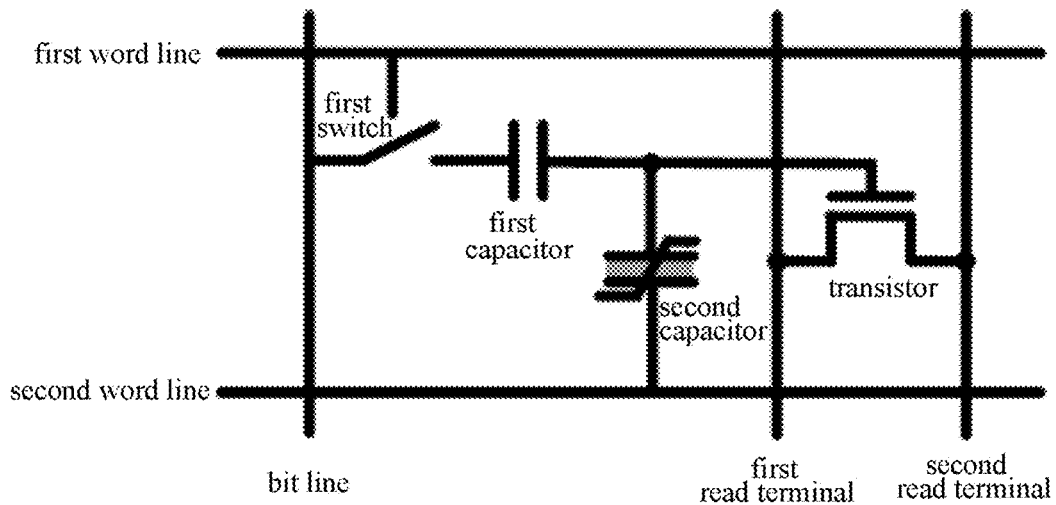
FIG. 7a and FIG. 7b illustrate schematic diagrams of the memory cells according to an embodiment of the present disclosure.
Figure 7B:
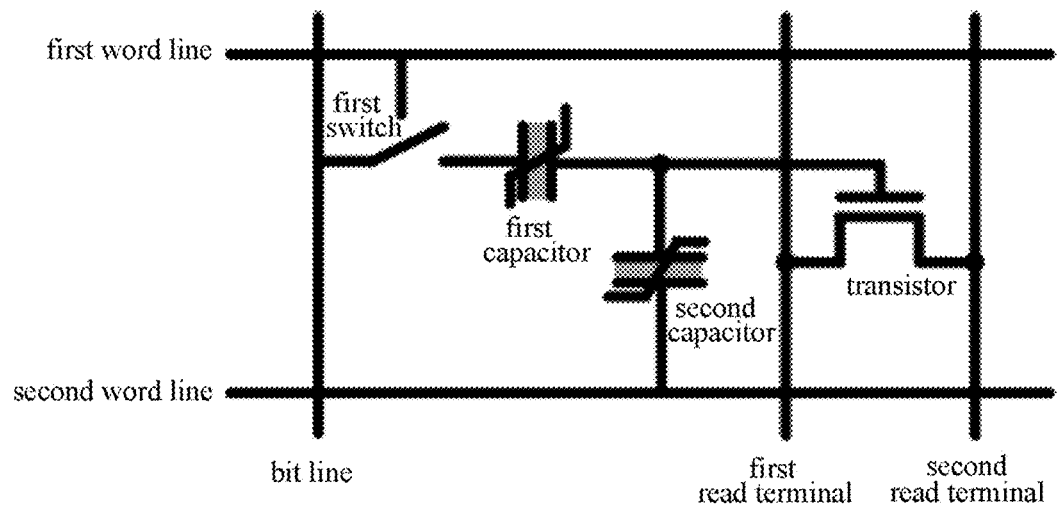

FIG. 7a and FIG. 7b illustrate schematic diagrams of the memory cells according to an embodiment of the present disclosure.

FIG. 7a and FIG. 7b are two variations of FIG. 1. In FIG. 7a, the first capacitor may be the ordinary capacitor without the ferroelectric property, and the second capacitor may be the ferroelectric capacitor; and in FIG. 7b, both the first capacitor and the second capacitor may be the ferroelectric capacitor. Similar to FIG. 1, the memory cell in FIG. 7a or FIG. 7b may still perform the write and read operations. When the write operation is performed on the memory cell in FIG. 7a or FIG. 7b, the internal node may generate the voltage corresponding to the data to be written; and when the read operation is performed on the memory cell in FIG. 7a or FIG. 7b, the value of the stored data in the memory cell may be determined according to the voltage change of the second read terminal.

It should be noted that in the actual circuit design, the capacitance value per unit area of the ferroelectric capacitor is greater than that of the conventional capacitor; and therefore, in a case of equal capacitance value, the area of the ferroelectric capacitor may be smaller. That is, in a case where both the first capacitor and the second capacitor are the ferroelectric capacitors, compared with the case where only the first capacitor is the ferroelectric capacitor, the integration degree of the memory cell is higher.

In a possible implementation, it may be seen from FIG. 7a that the second word line and the bit line may be exchanged. Furthermore, in FIG. 7b, both the first capacitor and the second capacitor are ferroelectric capacitors, and a common node of the first capacitor and the second capacitor is the internal node, so that the value of the stored data in FIG. 7b may be judged according to the voltage of the internal node; and during writing, the data writing may be performed by utilizing the hysteresis characteristic of the first capacitor, the hysteresis characteristic of the second capacitor or simultaneously utilizing the hysteresis characteristics of the first capacitor and the second capacitor. Those skilled in the art should understand that as long as the suitable voltage can be applied to two ends of the ferroelectric capacitor to hold or change the polarized state of the ferroelectric capacitor, the structure of the memory cell is not limited by the present disclosure.

Furthermore, for the two variations of FIG. 7a and FIG. 7b, the polarized state of the ferroelectric capacitor stored in the memory cell may be judged by measuring the current change of the second read terminal, so that the data reading is implemented by determining the value of the stored data in the memory cell. The working principle is similar to that in FIG. 1, which is not repeated.

In a possible implementation, the device includes at least one memory array, and each memory array includes a plurality of memory cells, and for any memory array: the first word line and the second word line are arranged in the row direction of the memory array, and the bit line, the first read terminal and the second read terminal are arranged in the column direction of the memory array; or the first word line, the second word line and the second read terminal are arranged in the row direction of the memory array, and the bit line and the first read terminal are arranged in the column direction of the memory array.

Figure 8:
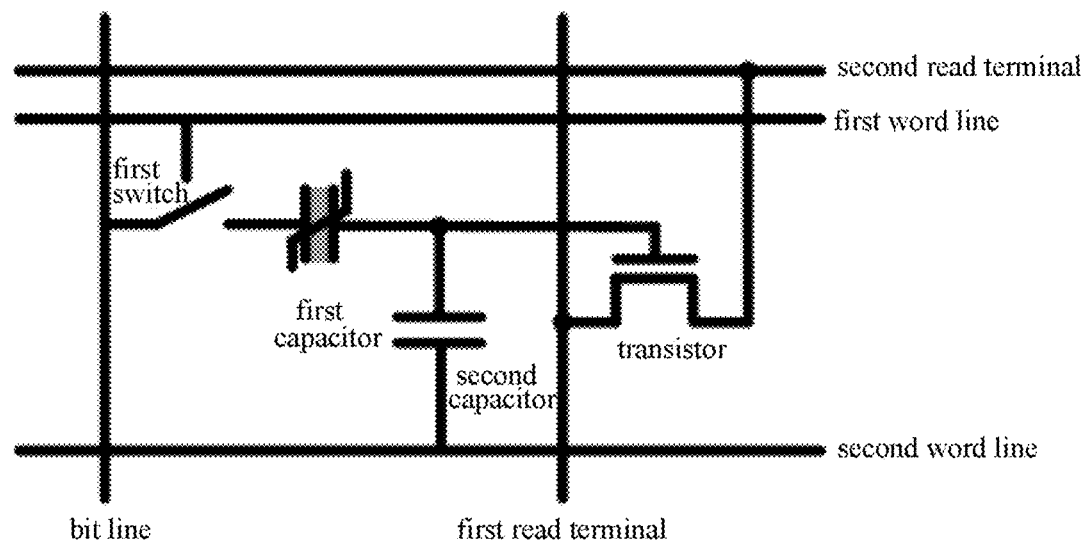
FIG. 8 illustrates a schematic diagram of the memory cell according to an embodiment of the present disclosure.

FIG. 8 illustrates a schematic diagram of the memory cell according to an embodiment of the present disclosure, and is a variation of FIG. 1.

As shown in FIG. 8, in a possible implementation, the second read terminal may be connected with the memory device of one row so as to perform row selection on the memory cells of a whole row, and determine the row where the memory cell needing to be read is located. In FIG. 8, the first word line, the second word line and the second read terminal all are arranged in the row direction of the memory array, and the bit line and the first read terminal are arranged in the column direction of the memory array. With the setting of FIG. 8, the value of the stored data in the memory cells of a whole row can be read at one time, which is simple and convenient.

In a possible implementation, the memory cell further includes a second switch; the external interface further includes a third word line; the second switch includes a fourth port, a fifth port and a sixth port, the fourth port is connected with the third word line, the fifth port is connected with the drain electrode, and the sixth port is connected with the second read terminal; and in a case where the fifth port and the sixth port are turned on, the drain electrode is connected with the second read terminal.

The present disclosure further provides a memory device based on a ferroelectric capacitor. The memory device includes a control unit and a plurality of memory cells arranged in an array; the memory unit includes an external interface, a first switch, a second switch, a first transistor, a first capacitor and a second capacitor; the external interface includes a first word line, a second word line, a third word line, a bit line, a first read terminal and a second read terminal, and at least one of the first capacitor and the second capacitor is a ferroelectric capacitor; the first switch includes a first port, a second port and a third port, the first port is connected with the first word line, the second port is connected with the bit line, and the third port is connected with one end of the first capacitor; the second switch includes a fourth port, a fifth port and a sixth port, the fourth port is connected with the third word line, and the sixth port is connected with the second read terminal; the transistor includes a gate electrode, a source electrode and a drain electrode, the gate electrode is connected with another end of the first capacitor and one end of the second capacitor respectively to form internal node, the source electrode is connected with the first read terminal, and the drain electrode is connected with the fifth port of the second switch; another end of the second capacitor is connected with the second word line; and the control unit is connected to the memory cell through the external interface and used to write data into the memory cell or read data from the memory cell.

Figure 9:
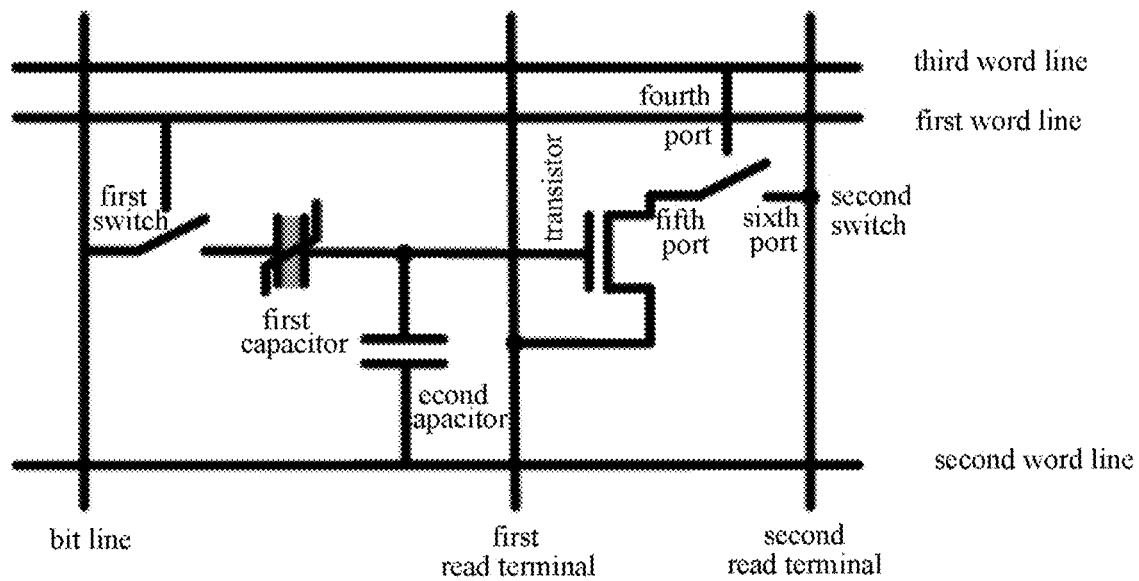
FIG. 9 illustrates a schematic diagram of the memory cell according to an embodiment of the present disclosure.

FIG. 9 illustrates a schematic diagram of the memory cell according to an embodiment of the present disclosure, and is another variation of FIG. 1.

As shown in FIG. 9, in a possible implementation, the second switch and the third word line that may perform the row selection may added on the basis of the memory cells in FIG. 1. The second switch includes a fourth port, a fifth port and a sixth port, the fourth port is connected with the third word line, the fifth port is connected with the drain electrode of the transistor, and the sixth port is connected with the second read terminal.

In a possible implementation, for FIG. 9, the control unit writing data into the memory cell includes: controlling the voltage of the first port of the first switch by the first word line, so that the second port and the third port of the first switch are turned on; determining the voltage of the bit line according to the value of data to be written, and biasing the second word line to the first write voltage; and after biasing the second word line to the first write voltage, biasing the second word line to the second write voltage, so that the polarized state of the ferroelectric capacitor is consistent with the value of the data to be written, wherein the polarized state of the ferroelectric capacitor is used to indicate the value of the written data.

Therefore, for the embodiment in FIG. 9, compared with FIG. 1, when the control unit writes data into the memory cell, it is necessary to control the second switch to be in an off state through the third word line, and the process of writing data in FIG. 9 is the same as the process of writing data in FIG. 1.

In a possible implementation, for FIG. 9, the control unit reading data from the memory cell includes: controlling the voltage of the fourth port of the second switch by the third word line, so that the fifth port and the sixth port of the second switch are turned on; biasing the first read terminal to the first read voltage, biasing the second read terminal to the second read voltage, and biasing the second word line to the third read voltage; after biasing the first read terminal to the first read voltage and biasing the second read terminal to the second read voltage, floating the first read terminal, and then biasing the second read terminal to a fifth read voltage, wherein the fifth read voltage is different from the first read voltage; and determining the value of the stored data in the memory cell according to the voltage change state of the first read terminal.

Therefore, for the embodiment in FIG. 9, compared with FIG. 1, when the control unit reads data from the memory cell, it is necessary to control the second switch to be in the on state through the third word line, and the process of reading data in FIG. 9 is the same as the process of reading data in FIG. 1.

In a possible implementation, the control unit reading data from the memory cell further includes: before biasing the second word line to the third read voltage, controlling the voltage of the first port of the first switch by the first word line, so that the second port and the third port of the first switch are turned off. It should be noted that when the first switch is in the on state, the control unit can also read data from the memory cell.

Because the transistor in the memory cell in FIG. 1 is in a slightly-on state when being turned on, a plurality of transistors in different rows are equivalent to parallel connection, which may affect the read/write logic in the memory cell; and therefore, the second switch is added on the basis of FIG. 1, the error occurrence rate of the read/write logic in the memory cell can be reduced, and the accuracy of reading and writing data from/into the memory cell by the control unit can be further ensured.

In a possible implementation, the device includes at least one memory array, each memory array includes a plurality of memory cells, and for any memory array: the first word line, the second word line and the third word line are arranged in the row direction of the memory array, and the bit line, the first read terminal and the second read terminal are arranged in the column direction of the memory array; or the first word line, the second word line, the third word line and the second read terminal are arranged in the row direction of the memory array, and the bit line and the first read terminal are arranged in the column direction of the memory array.

Figure 10:
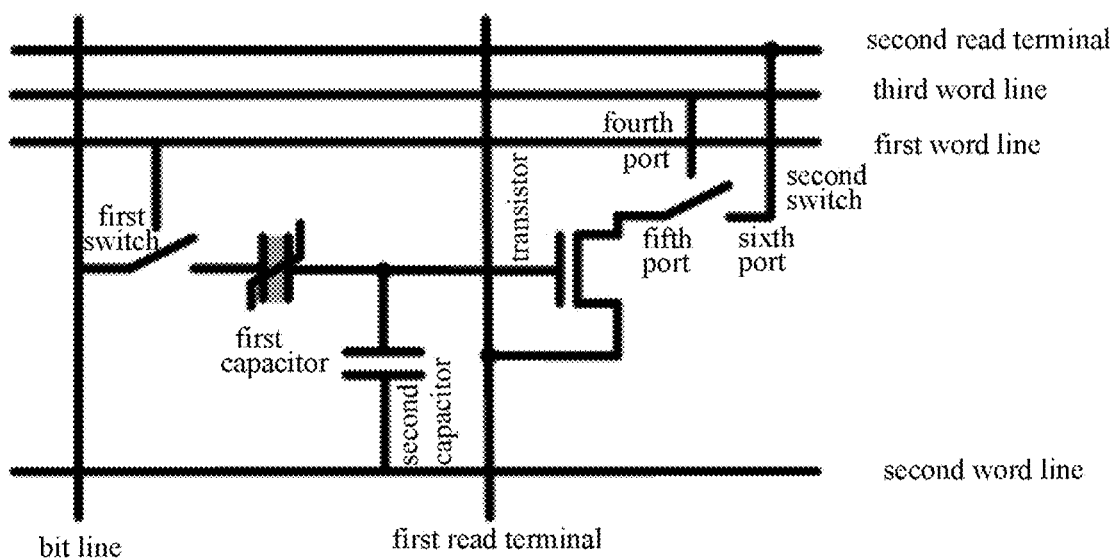
FIG. 10 illustrates a schematic diagram of the memory cell according to an embodiment of the present disclosure.

FIG. 10 illustrates a schematic diagram of the memory cell according to an embodiment of the present disclosure, and is another variation of FIG. 1.

As shown in FIG. 10, on the basis of FIG. 9, the second read terminal may be arranged from the column direction to the row direction. Similar to FIG. 8, the second read terminal is arranged in the row direction, so that the value of the stored data in the memory cells of a whole row can be read at one time, which is simple and convenient.

Furthermore, for FIG. 9, the polarized state of the ferroelectric capacitor stored in the memory cell may be judged by measuring the current change of the second read terminal, so that the data reading is implemented by determining the value of the stored data in the memory cell; and for FIG. 8 and FIG. 10, the second read terminal is located in the row direction, and at the moment, the polarized state of the ferroelectric capacitor stored in the memory cell may be judged by measuring the current change of the first read terminal, so that the data reading is implemented by determining the value of the stored data in the memory cell; and the working principle is similar to that in FIG. 1, which is not repeated.

Furthermore, for different variations of FIG. 7a, FIG. 7b, FIG. 8, FIG. 9 and FIG. 10, the multi-bit value may be written into the memory cell and read from the memory cell by changing the polarization degree of the ferroelectric capacitor; and the working principle is similar to that of FIG. 1, which is not repeated.

According to the present disclosure, a novel circuit structure and an operation mode are designed by utilizing the hysteresis characteristics of the polarization intensity-port voltage of the ferroelectric capacitor, the modulation of the voltage of the internal node by the second word line, and the adjustable characteristics of the relative areas of the first capacitor and the second capacitor, thus implementing the non-destructive reading of data and longer endurance of the write operation. For example, the data written into the memory cell at one time can support more than one million reads.

Although the embodiments of the present disclosure have been described above, it will be appreciated that the above descriptions are merely exemplary, but not exhaustive; and that the disclosed embodiments are not limiting. A number of variations and modifications may occur to those skilled in the art without departing from the scopes and spirits of the described embodiments. The terms in the present disclosure are selected to provide the best explanation on the principles and actual applications of the embodiments or the technical improvements to the arts on market, or to make the embodiments described herein understandable to those skilled in the art.

What is claimed is:

1. A memory device based on a ferroelectric capacitor, comprising: a control unit and a plurality of memory cells arranged in an array, wherein the memory cell includes an external interface, a first switch, a transistor, a first capacitor, and a second capacitor,
   the external interface includes a first word line, a second word line, a bit line, a first read terminal and a second read terminal, and at least one of the first capacitor or the second capacitor is a ferroelectric capacitor;
   the first switch includes a first port, a second port, and a third port, the first port is connected with the first word line, the second port is connected with the bit line, and the third port is connected with one end of the first capacitor;
   the transistor includes a gate electrode, a source electrode, and a drain electrode, the gate electrode is connected with another end of the first capacitor and one end of the second capacitor respectively to form an internal node, the source electrode is connected with the first read terminal, the drain electrode is connected with the second read terminal, and another end of the second capacitor is connected with the second word line, and
   the control unit is connected to the memory cell through the external interface and used to write data into the memory cell or read data from the memory cell.

2. The device according to claim 1, wherein the control unit writing data into the memory cell including:
   controlling a voltage of the first port of the first switch through the first word line, so that the second port and the third port of the first switch are connected;
   determining a voltage of the bit line based on a value of data to be written, and biasing the second word line to a first write voltage; and
   after biasing the second word line to the first write voltage, biasing the second word line to a second write voltage, so that a polarized state of the ferroelectric capacitor is consistent with the value of the data to be written, wherein the polarized state of the ferroelectric capacitor is used to indicate the value of the written data.

3. The device according to claim 2, wherein the control unit determining the voltage of the bit line based on the value of the data to be written including:
   determining whether the voltage of the bit line is at high level or low level based on the data to be written being a single-bit value; and
   determining whether the voltage of the bit line is at high level, low level, or intermediate level based on the data to be written being a multi-bit value, wherein the intermediate level is higher than the low level and lower than the high level.

4. The device according to claim 1, wherein the control unit reading data from the memory cell including:
   biasing the first read terminal to a first read voltage, biasing the second read terminal to a second read voltage, and biasing the second word line to a third read voltage;
   after biasing the first read terminal to the first read voltage and biasing the second read terminal to the second read voltage, floating the second read terminal, and then biasing the first read terminal to a fourth read voltage, wherein the fourth read voltage is different from the second read voltage; and
   determining a value of the stored data in the memory cell based on a voltage change state of the second read terminal.

5. The device according to claim 2, wherein the control unit reading data from the memory cell including:
   biasing the first read terminal to a first read voltage, biasing the second read terminal to a second read voltage, and biasing the second word line to a third read voltage;
   after biasing the first read terminal to the first read voltage and biasing the second read terminal to the second read voltage, floating the second read terminal, and then biasing the first read terminal to a fourth read voltage, wherein the fourth read voltage is different from the second read voltage; and
   determining a value of the stored data in the memory cell based on a voltage change state of the second read terminal.

6. The device according to claim 3, wherein the control unit reading data from the memory cell including:
   biasing the first read terminal to a first read voltage, biasing the second read terminal to a second read voltage, and biasing the second word line to a third read voltage;
   after biasing the first read terminal to the first read voltage and biasing the second read terminal to the second read voltage, floating the second read terminal, and then biasing the first read terminal to a fourth read voltage, wherein the fourth read voltage is different from the second read voltage; and
   determining a value of the stored data in the memory cell based on a voltage change state of the second read terminal.

7. The device according to claim 4, wherein the control unit reading data from the memory cell further including:
   prior to biasing the second word line to the third read voltage, controlling the voltage of the first port of the first switch through the first word line, so that the second port and the third port of the first switch are disconnected.

8. The device according to claim 5, wherein the control unit reading data from the memory cell further including:
   prior to biasing the second word line to the third read voltage, controlling the voltage of the first port of the first switch through the first word line, so that the second port and the third port of the first switch are disconnected.

9. The device according to claim 6, wherein the control unit reading data from the memory cell further including:

prior to biasing the second word line to the third read voltage, controlling the voltage of the first port of the first switch through the first word line, so that the second port and the third port of the first switch are disconnected.

10. The device according to claim 1, wherein the device includes at least one memory array, each memory array includes a plurality of memory cells, for any of the at least one memory array:
the first word line and the second word line are arranged in a row direction of the memory array, and the bit line, the first read terminal, and the second read terminal are arranged in a column direction of the memory array.

11. The device according to claim 2, wherein the device includes at least one memory array, each memory array includes a plurality of memory cells, for any of the at least one memory array:
the first word line and the second word line are arranged in a row direction of the memory array, and the bit line, the first read terminal, and the second read terminal are arranged in a column direction of the memory array.

12. The device according to claim 3, wherein the device includes at least one memory array, each memory array includes a plurality of memory cells, for any of the at least one memory array:
the first word line and the second word line are arranged in a row direction of the memory array, and the bit line, the first read terminal, and the second read terminal are arranged in a column direction of the memory array.

13. The device according to claim 4, wherein the device includes at least one memory array, each memory array includes a plurality of memory cells, for any of the at least one memory array:
the first word line and the second word line are arranged in a row direction of the memory array, and the bit line, the first read terminal, and the second read terminal are arranged in a column direction of the memory array.

14. The device according to claim 5, wherein the device includes at least one memory array, each memory array includes a plurality of memory cells, for any of the at least one memory array:
the first word line and the second word line are arranged in a row direction of the memory array, and the bit line, the first read terminal, and the second read terminal are arranged in a column direction of the memory array.

15. The device according to claim 6, wherein the device includes at least one memory array, each memory array includes a plurality of memory cells, for any of the at least one memory array:
the first word line and the second word line are arranged in a row direction of the memory array, and the bit line, the first read terminal, and the second read terminal are arranged in a column direction of the memory array.

* * * * *